United States Patent
Krishnan et al.

(10) Patent No.: US 8,449,339 B2
(45) Date of Patent: May 28, 2013

(54) CONNECTOR ASSEMBLY AND METHOD OF MANUFACTURE

(75) Inventors: Shutesh Krishnan, Negeri Sembilan (MY); Soon Wei Wang, Negeri Sembilan (MY)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/948,977

(22) Filed: Nov. 18, 2010

(65) Prior Publication Data

US 2012/0064781 A1 Mar. 15, 2012

(30) Foreign Application Priority Data

Sep. 15, 2010 (MY) .................... P1 2010004311

(51) Int. Cl.
*H01R 9/24* (2006.01)
(52) U.S. Cl.
USPC ........................................ 439/884
(58) Field of Classification Search
USPC ................................ 439/884–886
See application file for complete search history.

(56) References Cited

U.S. PATENT DOCUMENTS

| | | | |
|---|---|---|---|
| 4,962,585 A * | 10/1990 | Kobayashi | 29/885 |
| 5,241,134 A * | 8/1993 | Yoo | 174/94 R |
| 5,291,061 A | 3/1994 | Ball | |
| 5,313,096 A | 5/1994 | Eide | |
| 5,532,512 A | 7/1996 | Fillion et al. | |
| 6,031,279 A | 2/2000 | Lenz | |
| 6,177,721 B1 | 1/2001 | Suh et al. | |
| 6,291,881 B1 * | 9/2001 | Yang | 257/723 |
| 6,507,098 B1 | 1/2003 | Lo et al. | |
| 6,650,006 B2 | 11/2003 | Huang et al. | |
| 6,717,251 B2 | 4/2004 | Matsuo et al. | |
| 6,720,643 B1 | 4/2004 | Fox et al. | |
| 6,774,475 B2 | 8/2004 | Blackshear et al. | |
| 6,774,476 B2 | 8/2004 | Spitz et al. | |
| 6,995,463 B1 | 2/2006 | Sutardja | |
| 7,005,734 B2 | 2/2006 | Choi et al. | |
| 7,030,317 B1 * | 4/2006 | Oman | 174/541 |
| 7,193,307 B2 | 3/2007 | Duggan | |
| 7,264,869 B2 * | 9/2007 | Tobita et al. | 428/323 |
| 7,271,477 B2 | 9/2007 | Saito et al. | |
| 7,470,154 B2 * | 12/2008 | Sato | 439/693 |
| 7,485,954 B2 | 2/2009 | Havanur | |
| 7,569,920 B2 | 8/2009 | Otremba et al. | |
| 7,598,600 B2 | 10/2009 | Tang et al. | |
| 7,615,854 B2 * | 11/2009 | Montgomery | 257/678 |
| 7,687,898 B2 | 3/2010 | Hung et al. | |
| 7,705,434 B2 | 4/2010 | Otremba | |
| 2002/0042228 A1 * | 4/2002 | Yoshioka | 439/610 |
| 2003/0027459 A1 * | 2/2003 | Lee | 439/693 |
| 2004/0222433 A1 | 11/2004 | Mazzochette et al. | |
| 2005/0017339 A1 * | 1/2005 | Yoshiba et al. | 257/686 |
| 2005/0191913 A1 * | 9/2005 | Farnworth et al. | 439/862 |

FOREIGN PATENT DOCUMENTS

WO 2009070359 A1 6/2009

* cited by examiner

*Primary Examiner* — Tulsidas C Patel
*Assistant Examiner* — Phuongchi T Nguyen
(74) *Attorney, Agent, or Firm* — Rennie William Dover

(57) ABSTRACT

A connector assembly and a method for manufacturing the connector assembly. In accordance with embodiments, the connector assembly includes an electrical connector having first and second surfaces and first and second ends. A layer of electrically insulating material is formed from or on a portion of the first surface at the first end. Optionally, a layer of electrically insulating material can be formed from or on the second surface.

19 Claims, 3 Drawing Sheets

400

416

420

440

440

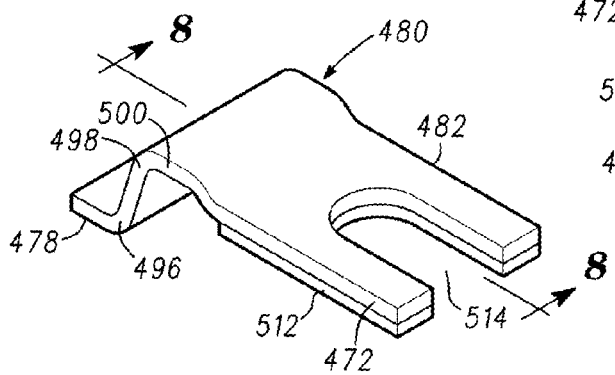
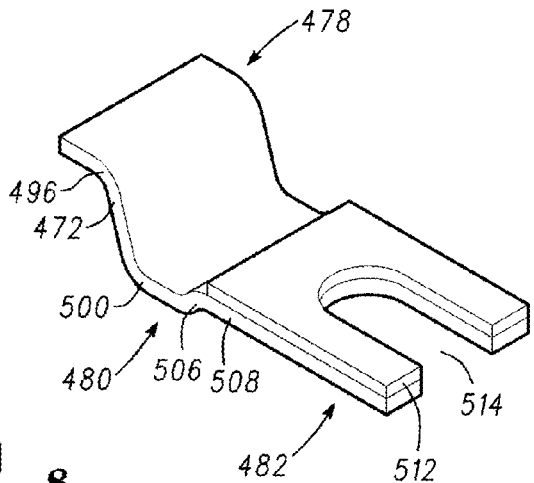
FIG. 6
470
FIG. 7
470
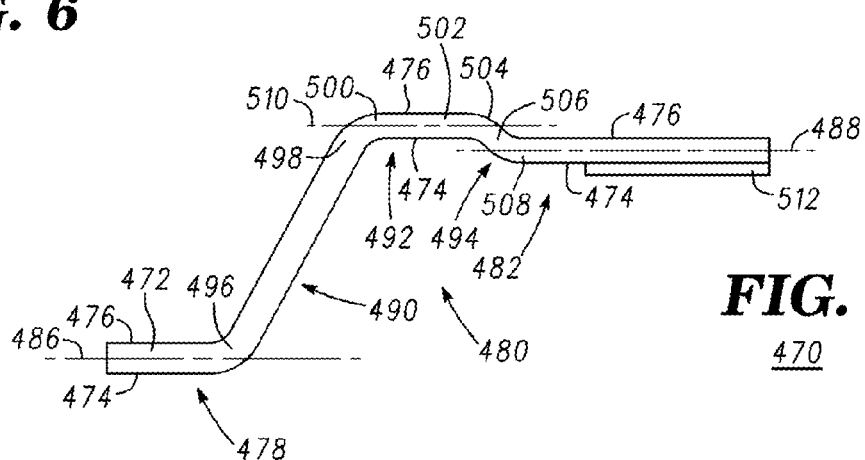
FIG. 8
470
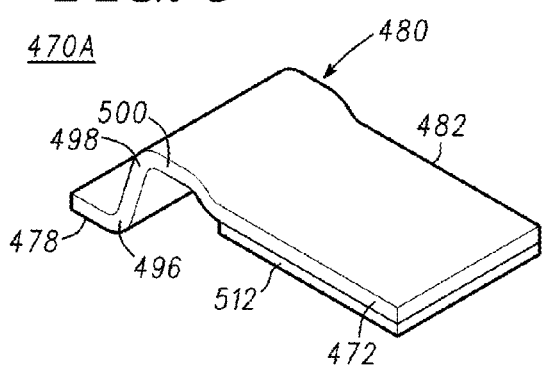
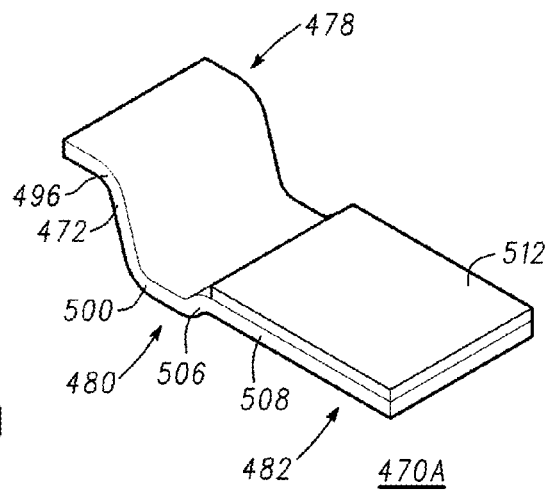
FIG. 9
470A
FIG. 10
470A

520

520

550

CONNECTOR ASSEMBLY AND METHOD OF MANUFACTURE

BACKGROUND

The present invention relates, in general, to electronics and, more particularly, to connector assemblies.

In the past, the semiconductor industry manufactured semiconductor components comprising a single semiconductor die within a protective structure such as, for example, a mold compound. Various types of semiconductor components were mounted to a printed circuit board which contained interconnect structures that allowed the semiconductor components to communicate with each other. As the demand for more functionality in electronic devices increased, it became desirable to include more semiconductor components on the printed circuit boards. Thus, semiconductor manufacturers have worked to manufacture semiconductor components with smaller outlines and mounting footprints.

In some embodiments, semiconductor die were vertically stacked on top of one another with an interposing layer of adhesive material attached to the semiconductor die in order to bond the die together to form a multi-chip or multi-die structure. The multi-chip structure was attached to a glass-epoxy type printed circuit board substrate or other similar substrate. The semiconductor die were then wire bonded to the substrate to form electrical interconnections between the substrate and the semiconductor die. One example of such a package configuration is disclosed in U.S. Pat. No. 6,650,019 issued to Thomas B. Glenn et al. on Nov. 18, 2003. Another example of an electronic assembly with stacked integrated circuit die is disclosed in U.S. Pat. No. 7,030,317, issued to Todd P. Oman on Apr. 18, 2006.

Drawbacks with stacking semiconductor die include forming electrical interconnects between the semiconductor die and removing heat from the stacked structure.

Accordingly, it would be advantageous to have a connector assembly that suitable for transmitting electrical signals between the semiconductor die and semiconductor components and that provides sufficient thermal dissipation from the semiconductor die. It would be advantageous for the electronic assembly and method to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 6 is an isometric view of the connector assembly in accordance with embodiments of the present invention;

FIG. 7 is an isometric view of the connector assembly of FIG. 6 in an inverted orientation relative to the orientation shown in FIG. 6;

FIG. 8 is a side view of the connector assembly of FIGS. 6 and 7;

FIG. 9 is an isometric view of the connector assembly in accordance with embodiments of the present invention;

FIG. 10 is an isometric view of the connector assembly of FIG. 9 in an inverted orientation relative to the orientation shown in FIG. 9;

DETAILED DESCRIPTION

Generally, the present invention provides a connector assembly and a method for manufacturing the connector assembly. In accordance with embodiments of the present invention, a connector assembly comprises an electrical connector having opposing surfaces and opposing ends. A central region is between the opposing ends. An electrically insulating material is formed on one surface in one of the ends of the electrical connector. Alternatively, electrically insulating material can be formed on opposing surfaces in the first and second ends.

Figure 1:
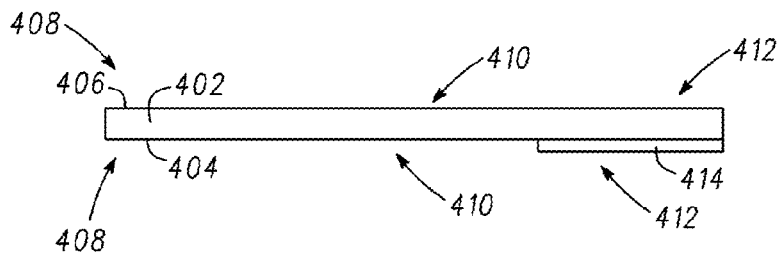
FIG. 1 is a side view of a portion of a connector assembly in accordance with embodiments of the present invention.

FIG. 1 is a side view of a connector assembly 400 in accordance with an embodiment of the present invention. What is shown in FIG. 1 is a rectangularly shaped electrical connector 402 having opposing surfaces 404 and 406, end regions or portions 408 and 412, and a central region or portion 410. By way of example, electrical connector 402 comprises copper. Other suitable materials for electrical connector 402 include aluminum, tin, steel, a metal clip coated with precious metals, alloys of copper, beryllium, gold, silver, alloys of aluminum, brass, alloys of brass, or the like. Electrical connector 402 may be etched or cut from a sheet of, for example, copper having a thickness ranging from about 150 micrometers (μm) to about 250 μm.

A layer of an electrically insulating material 414 having a thickness ranging from about 50 μm to about 100 μm is formed on surface 404 in end region 412. Electrically insulating material 414 may be aluminum oxide, nitride, a thermally insulating material, ceramic, or the like. Alternatively surface 404 in region 412 may be anodized.

Figure 2:
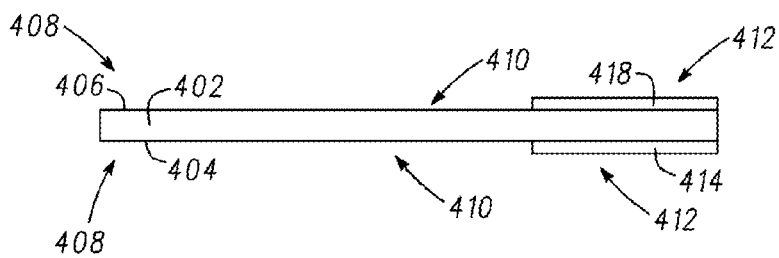
FIG. 2 is a side view of a portion of a connector assembly in accordance with embodiments of the present invention.

FIG. 2 is a side view of a connector assembly 416 in accordance with another embodiment of the present invention. Connector assembly 416 is similar to connector assembly 400 but includes a layer of an electrically insulating material 418 formed on surface 406 in end region 412. Electrically insulating material 418 may be the same as electrically insulating material 414 or it may be different from electrically insulating material 414. Alternatively, surfaces 404 and 406 in end region 412 may be anodized.

Figure 3:
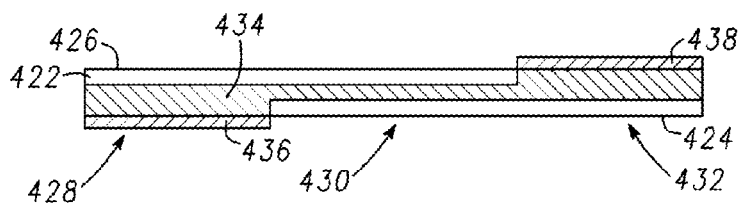
FIG. 3 is a cross-sectional view of a portion of a connector assembly in accordance with embodiments of the present invention.

FIG. 3 is a cross-sectional view of a connector assembly 420 in accordance with another embodiment of the present invention. What is shown in FIG. 3 is a substrate 422 having opposing surfaces 424 and 426, end regions or portions 428 and 432, and a central region or portion 430. Substrate 422 is preferably formed from a resin, such as epoxy, polyimide, triazine, or a phenolic resin, a bismaleimidetriazine (BT) resin, epoxy-glass composites, printed circuit board (PCB) materials, FR-4, ceramics, or the like. Alternatively, substrate 422 may be comprised of flex board material or a selectively anodized Al substrate. An electrically conductive interconnect layer 434 is formed in substrate 422. An electrically conductive contact 436 is formed in contact with the portion of interconnect layer 434 in end region 428 and an electrically conductive contact 438 is formed in contact with the portion of interconnect layer 434 in end region 432. Electrically conductive contacts 436 and 438 may be formed by patterning conductive foils using lithographic techniques, screen printing, deposition onto the portions of interconnect layer 434 in end regions 428 and 432, or the like.

Although connector assembly 420 is shown as having electrically conductive contacts 436 and 438 in end regions 428 and 432, respectively, this is not a limitation of the present invention. Alternatively, electrically conductive contact 438 may be absent from end region 432 or electrically conductive contact 436 may be absent from end region 428.

Figure 4:
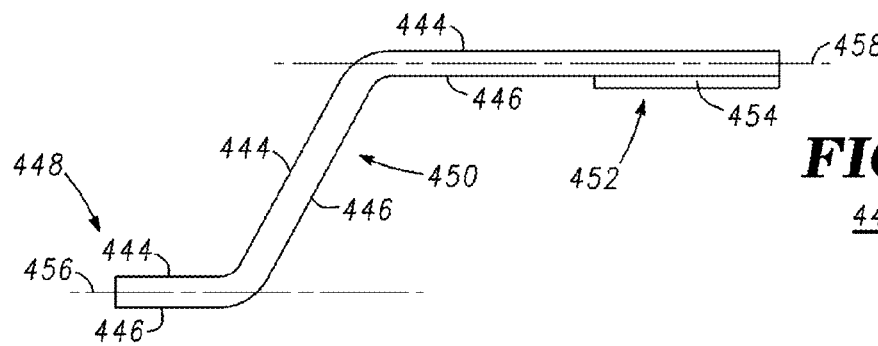
FIG. 4 is a side view of a portion of a connector assembly in accordance with embodiments of the present invention.

FIG. 4 is a side view of a connector assembly 440 in accordance with another embodiment of the present invention. What is shown in FIG. 4 is a rectangularly shaped electrical connector 442 having opposing surfaces 444 and 446, end regions or portions 448 and 452, and a central region or portion 450. By way of example, electrical connector 442 comprises copper. Other suitable materials for electrical connector 442 include aluminum, tin, steel, metal clip coated with precious metals, alloys of copper, beryllium, gold, silver, alloys of aluminum, brass, alloys of brass, or the like. Electrical connector 442 may be etched or cut from a sheet of, for example, copper having a thickness ranging from about 150 $\mu$m to about 200 $\mu$m and stamped or coined such that end region 448 is in a horizontal plane identified by broken line 456 and end region 452 is in a horizontal plane identified by broken line 458. Horizontal planes 456 and 458 are preferably spaced apart from each other in a vertical direction.

A layer of an electrically insulating material 454 having a thickness ranging from about 50 $\mu$m to about 100 $\mu$m is formed on a portion of surface 446 in end region 452. Alternatively, the layer of electrically insulating material 454 may be formed on substantially all of the portion of surface 446 in end region 452. Electrically insulating material 454 may be aluminum oxide, nitride, a thermally insulating material, ceramic, or the like. Alternatively surface 446 in region 452 may be anodized.

Figure 5:
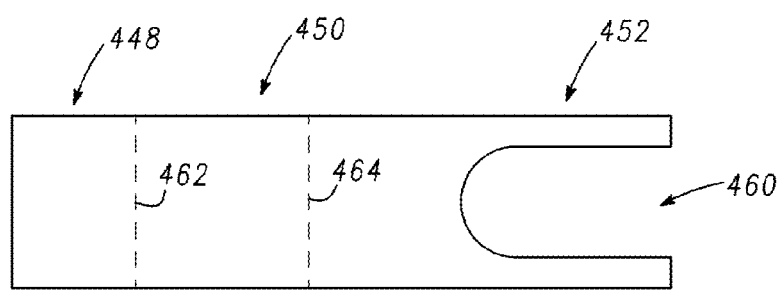
FIG. 5 is a top view of the portion of the connector assembly of FIG. 4.

FIG. 5 is a top view of an embodiment of connector assembly 440 shown in FIG. 4. What is shown in FIG. 5 is electrical connector 442 having surface 444 and end regions 448 and 452 connected to each other by central region 450. A notch 460 extends from an end of end region 452 into a end region 452. The portion of electrical connector 442 into which notch 460 extends may be referred to as a body region. The region where end region 448 and central region 450 meet is identified by broken line 462 and the region where end region 450 and end region 452 meet is identified by broken line 464.

It should be noted that notch 460 is optional and may be absent from electrical connector 440.

FIGS. 6-8 illustrate a connector assembly 470 in accordance with another embodiment of the present invention. FIGS. 6 and 7 are isometric views of connector assembly 470 and FIG. 8 is a side view of connector assembly 470. For the sake of clarity, FIGS. 6-8 will be described together. What is shown in FIGS. 6-8 is connector assembly 470 comprising an electrical connector 472 having opposing surfaces 474 and 476, end regions or portions 478 and 482, and a central region or portion 480. By way of example, electrical connector 472 comprises copper. Other suitable materials for electrical connector 472 include aluminum, tin, steel, a metal clip coated with precious metals, alloys of copper, beryllium, gold, silver, alloys of aluminum, brass, alloys of brass, or the like. Electrical connector 472 may be etched or cut from a sheet of, for example, copper having a thickness ranging from about 150 micrometers ($\mu$m) to about 200 $\mu$m and stamped or coined such that end region 478 is in a horizontal plane identified by broken line 486 and end region 482 is in a horizontal plane identified by broken line 488. The horizontal planes in which broken lines 486 and 488 are located are preferably spaced apart from each other in a vertical direction.

Central region 480 comprises end subregions 490 and 494 connected together by a central subregion 492. An end 496 of subregion 490 meets end region 478 and an end 498 of subregion 490 meets an end 500 of central subregion 492. An end 502 of central subregion 492 meets an end 504 of subregion 494 and an end 506 of subregion 494 meets and end 508 of end region 482. Central subregion 492 is in a horizontal plane identified by broken line 510. Preferably, the horizontal plane in which broken line 492 is located is between and vertically spaced apart from the horizontal planes in which broken lines 486 and 488 are located, i.e., central region 492 is in a horizontal plane that is between and vertically spaced apart from the horizontal plane in which end regions 486 and 488 are located.

A layer of an electrically insulating material 512 having a thickness ranging from about 50 $\mu$m to about 100 $\mu$m is formed on a portion of surface 474 in end region 482. Alternatively, the layer of electrically insulating material 512 may be formed on substantially all of the portion of surface 474 in end region 482. Electrically insulating material 512 may be aluminum oxide, nitride, a thermally insulating material, ceramic, or the like. Alternatively, electrically insulating layer 512 may be absent and a portion or all of surface 474 in region 482 may be anodized.

A notch 514 extends into end region 482. The portion of electrical connector 472 into which notch 514 extends may be referred to as a body region.

FIG. 9 is an isometric view of a connector assembly 470A in which notch 514 is absent. Reference character "A" has been appended to reference character 470 to distinguish a connector assembly with a notch from a connector assembly without a notch.

FIG. 10 is an isometric view of a connector assembly 470A in which a layer of electrically insulating material 512A is formed on surface 474 in end region 482. Alternatively, layer of electrically insulating material 512 is absent from connector assembly 470A shown in FIGS. 9 and 10 and surface 474 in end region 482 is anodized.

Figure 11:
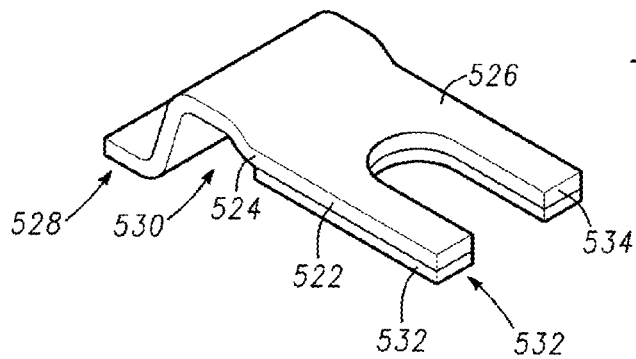
FIG. 11 is an isometric view of the connector assembly in accordance with embodiments of the present invention.
Figure 12:
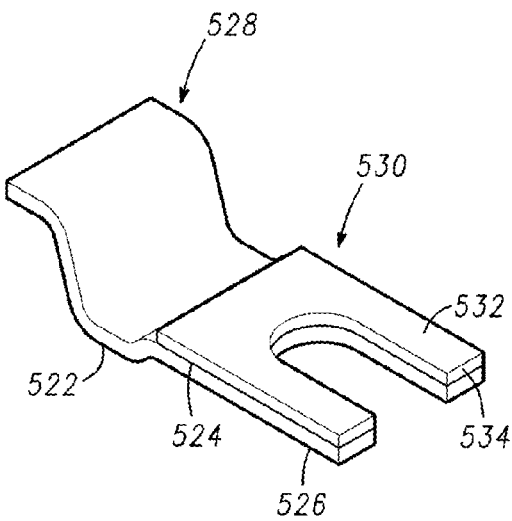
FIG. 12 is an isometric view of the connector assembly of FIG. 11 in an inverted orientation relative to the orientation shown in FIG. 11.

FIGS. 11 and 12 are isometric views of a connector assembly 520 comprising an electrical connector 522 in accordance with another embodiment of the present invention. Electrical connector 522 has opposing surfaces 524 and 526, end regions or portions 528 and 532, and a central region or portion 530 and comprises aluminum. Surface 526 in end region 532 is anodized to form an aluminum oxide layer 534 having a thickness ranging from about 50 $\mu$m to about 100 $\mu$m. It should be noted that a portion of surface 526 in end region 532 may be anodized or substantially all of surface 526 in end region 532 may be anodized.

Figure 13:
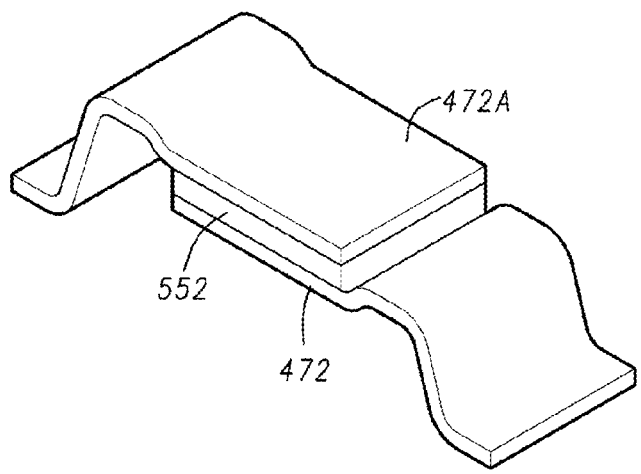
FIG. 13 is an isometric view of a connector assembly in accordance with embodiments of the present invention.

FIG. 13 is an isometric view of a connector assembly 550 in accordance with another embodiment of the present invention. What is shown in FIG. 12 is connector assembly 550 comprising an electrical connector 472 having opposing surfaces 474 and 476, end regions or portions 478 and 482, and a central region or portion 480. Electrical connector 472 has been described with reference to FIGS. 6-8.

A layer of an electrically insulating material 552 having a thickness ranging from about 50 $\mu$m to about 100 $\mu$m is formed on surface 476 in end region 482. Electrically insulating material 552 may be aluminum oxide, nitride, a thermally insulating material, ceramic, or the like. Alternatively surface 474 in region 482 may be anodized. In accordance with embodiments in which electrical connector 472 is aluminum, anodizing surface 474 forms aluminum oxide from surface 474.

An electrical connector 472A is coupled to electrically insulating layer 552 to form connector assembly 550. More particularly, surface 474 in end region 482. Reference character "A" has been appended to reference character 472 to distinguish the two electrical connectors that form connector assembly 550. The number of electrical connectors 472 stacked on each other to form a connector assembly is not a limitation of the present invention.

By now it should be appreciated that a connector assembly and a method for manufacturing the connector assembly have been provided. In accordance with embodiments of the present invention, the connector assembly comprises an electrical connector having opposing ends and opposing surfaces. An electrically insulating material may be formed on portions of one or both surfaces in one or both ends of the electrical connector. The connector assembly can be used to form semiconductor components having stacked semiconductor die. The connector assembly allows stacking of the semiconductor die thereby decreasing the footprint on a printed circuit board and allowing efficient removal of heat from the semiconductor component.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A connector assembly, comprising:
   a first electrical connector having first and second ends and first and second surfaces; and
   a first electrically insulating material on the first surface at the first end, wherein the electrically insulating material is an electrically insulating material selected from the group of electrically insulating materials comprising ceramic, nitride, and a metallic base oxide.

2. The connector assembly of claim 1, wherein the electrically insulating material is ceramic.

3. The connector assembly of claim 1, wherein the electrically insulating material is the metallic base oxide.

4. The connector assembly of claim 1, wherein the electrically insulating material is nitride.

5. The connector assembly of claim 1, wherein the electrically insulating material is a thermally conductive material.

6. The connector assembly of claim 1, further including a second electrically insulating material on the second surface at the first end.

7. The connector assembly of claim 1, wherein the first electrical connector comprises an electrically conductive material.

8. The connector assembly of claim 7, wherein the electrically conductive material is metal.

9. The connector assembly of claim 7, wherein the electrically conductive material is copper.

10. The connector assembly of claim 7, wherein the electrically conductive material is aluminum.

11. The connector assembly of claim 1, wherein the first electrical connector has first, second, and third sections, the first section coupled to the third section by the second section.

12. The connector assembly of claim 11, wherein the first section is in a first horizontal plane and the third section is in a second horizontal plane.

13. The connector assembly of claim 12, wherein the second section comprises:
   first, second, and third subsections, the first subsection coupled to the third subsection by the second subsection, the section subsection in a third horizontal plane, the third horizontal plane vertically between the first and second horizontal planes.

14. The connector assembly of claim 11, wherein the third section is planar, has a body portion, an end, and a notch extending from the end into the body portion.

15. The connector assembly of claim 14, further comprising a second electrical connector, the second electrical connector coupled to the first electrically insulating material on the first surface of the first end at the first electrical connector.

16. A method for manufacturing a connector assembly, comprising:
   providing an electrical connector having first and second surfaces and first and second ends; and
   forming an electrically insulating material over a portion of the first surface at the first end, wherein the electrically insulating material is an electrically insulating material selected from the group of electrically insulating materials comprising ceramic, nitride, and a metallic base oxide.

17. A method, comprising:
   providing a first electrical connector having first and second surfaces and first and second ends, wherein providing the first electrical connector includes forming the first electrical connector to have the first end in a first horizontal plane and the second end in a second horizontal plane; and
   forming an electrically insulating material over a portion of the first surface at the first end, wherein the electrically insulating material is an electrically insulating material selected from the group of electrically insulating materials comprising ceramic, nitride, and oxide.

18. The method of claim 17, wherein providing the first electrical connector includes forming the first electrical connector to have a central region between the first and second ends, wherein the central region includes a portion in a third horizontal plane, the third horizontal plane between the first and second horizontal planes.

19. The method of claim 18, further including coupling a second electrical connector to the electrically insulating material over the portion of the first surface at the first end of the first electrical connector.

* * * * *